(12) United States Patent
Cami Gonzalez

(10) Patent No.: US 11,037,647 B1
(45) Date of Patent: Jun. 15, 2021

(54) SYSTEMS AND METHODS FOR UPDATING MEMORY CIRCUITRY

(71) Applicant: SEMICONDUCTOR COMPONENTS INDUSTRIES, LLC, Phoenix, AZ (US)

(72) Inventor: Sergi Cami Gonzalez, Thacham (GB)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/795,090

(22) Filed: Feb. 19, 2020

(51) Int. Cl.
  *G11C 5/14* (2006.01)
  *G11C 29/42* (2006.01)
  *G11C 29/44* (2006.01)
  *G06F 11/10* (2006.01)
  *G11C 17/08* (2006.01)
  *G11C 29/00* (2006.01)

(52) U.S. Cl.
  CPC .......... *G11C 29/42* (2013.01); *G06F 11/1068* (2013.01); *G11C 17/08* (2013.01); *G11C 29/44* (2013.01); *G11C 29/78* (2013.01)

(58) Field of Classification Search
  CPC ......... G11C 29/42; G11C 17/08; G11C 29/44; G11C 29/78; G06F 11/1068
  USPC .................................................. 365/185.09
  See application file for complete search history.

(56) References Cited

U.S. PATENT DOCUMENTS

| 2009/0119444 A1 | 5/2009 | Davis |
| 2014/0244991 A1* | 8/2014 | Akdemir ............... G06F 9/4406 713/2 |
| 2017/0063401 A1 | 3/2017 | Jeganathan et al. |

\* cited by examiner

*Primary Examiner* — Huan Hoang
(74) *Attorney, Agent, or Firm* — Treyz Law Group, P.C.; Tianyi He

(57) ABSTRACT

An electronic system such as an imaging system may include processing circuitry and memory circuitry. The memory circuitry may include one-time-programmable memory having error correction code functionalities (e.g., SECDED functionalities). The one-time-programmable memory may have a first set of previously programmed bits and a second set of unprogrammed and unused bits. The processing circuitry may process instructions to update a bit in the second set of bits. To preserve the ECC functionalities (e.g., the ECC check bits associated with the first and second sets of bits, the processing circuitry may also update additional bits in the second set of bits.

20 Claims, 6 Drawing Sheets

FIG. 3

| BIT POSITION | 0 | 1 | 2 | 3 | 4 | 5 | 6 | 7 | 8 | 9 | 10 | 11 | 12 | 13 | 14 | 15 | p0 | p1 | p2 | p3 | p4 | p5 |
|---|---|---|---|---|---|---|---|---|---|---|---|---|---|---|---|---|---|---|---|---|---|---|
| FIELD NAMES: | VAR | | | | | | A | | | | RESERVED | | | | | B | ECC VALUE = X | | | | | |
| VALUES | ? | ? | ? | ? | ? | ? | ? | ? | ? | ? | ? | ? | ? | ? | 0 | 0 | | | | | | |

FIG. 4

| BIT POSITION | 0 | 1 | 2 | 3 | 4 | 5 | 6 | 7 | 8 | 9 | 10 | 11 | 12 | 13 | 14 | 15 | p0 | p1 | p2 | p3 | p4 | p5 |
|---|---|---|---|---|---|---|---|---|---|---|---|---|---|---|---|---|---|---|---|---|---|---|
| FIELD NAMES: | VAR | | | | | | A | | | | RESERVED | | | | | B | ECC VALUE = X | | | | | |
| VALUES | ? | ? | ? | ? | ? | ? | ? | ? | ? | ? | ? | ? | ? | ? | 1 | 1 | | | | | | |

| DATA | PARITY BITS (ECC) | VIRTUAL MEANING |
|---|---|---|
| 0000000000000000 | 000000 | INITIAL VERSION |
| 1000000000000000 | 100011 | VERSION 1 |
| 1110110000000000 | 100011 | VERSION 2 |
| 1111111000000000 | 101111 | VERSION 3 |
| 1111111111000000 | 101111 | VERSION 4 |
| 1111111111101111 | 101111 | VERSION 5 |

SYSTEMS AND METHODS FOR UPDATING MEMORY CIRCUITRY

BACKGROUND

This relates generally to memory circuitry in electronic systems such as imaging systems, and more specifically, to systems and methods for updating data stored within the memory circuitry (sometimes referred to herein as memory).

Modern electronic devices such as cellular telephones, cameras, computers, and other electronic system modules (e.g., electronic system modules integrated with automotive systems) require various types of memory circuitry. To robustly store data in memory circuitry, these systems often include memory with error correcting code (ECC), or ECC memory. As an example, the various types of memory circuitry can include one-time-programmable memory (OTPM) that stores ECC check bits used to detect and/or correct bit errors in the stored data based on an ECC value generated from the ECC check bits.

However, because each bit location of one-time-programmable memory is designed to be written once (e.g., during manufacturing), it can be difficult to modify data on (e.g., store additional data onto) the one-time-programmable memory in a desired manner during the lifetime of the memory. Furthermore, memory such as one-time-programmable memory can store ECC check bits (e.g., one-time-programmable memory with ECC functionalities). The ECC value should not be altered during the later data modification to preserve error checking and/or error correcting functionalities. This places further restrictions on modifying these types of memory circuitry.

It would therefore be desirable to provide systems and methods for updating data on memory circuitry such as one-time-programmable and/or ECC memory in a flexible manner that overcomes these issues.

BRIEF DESCRIPTION OF THE DRAWINGS

FIG. 3 is a diagram of an illustrative portion of memory circuitry useable in imaging systems, hosts subsystems, imaging circuitry, and/or any other types of systems or devices in accordance with some embodiments.

FIG. 4 is a diagram of the illustrative portion of the memory circuitry shown in FIG. 3 having data modified in a manner that preserves an ECC value in accordance with some embodiments.

FIG. 7 is a table of illustrative incremental states of stored data and parity bits and their associated exemplary interpretations in accordance with some embodiments.

DETAILED DESCRIPTION

Embodiments of the present invention relate to memory circuitry and processing circuitry (e.g., memory controller (or interface) circuitry) for accessing and modifying data stored in the memory circuitry. It will be recognized by one of ordinary skill in the art that the present exemplary embodiments may be practiced without some or all of these specific details. In other instances, well-known operations have not been described in detail in order not to unnecessarily obscure the present embodiments.

The memory circuitry and processing circuitry described herein may be generally implemented in a number of hardware systems. As examples, the memory circuitry and processing circuitry described herein may be implemented in as part of any electronic device such as a portable electronic device, a camera, a tablet computer, a desktop computer, a webcam, a cellular telephone, a video camera, a video surveillance system, an automotive imaging system, a video gaming system, or any other electronic device or system that may include or exclude imaging capabilities. The illustrative configuration of the memory circuitry and corresponding processing circuitry being formed as part of an imaging system or an electronic system that includes imaging capabilities is described in detail herein as examples. However, this is merely illustrative. If desired, the memory circuitry and corresponding processing circuitry may be implemented in any of the above-mentioned systems or in other suitable systems.

Figure 1:
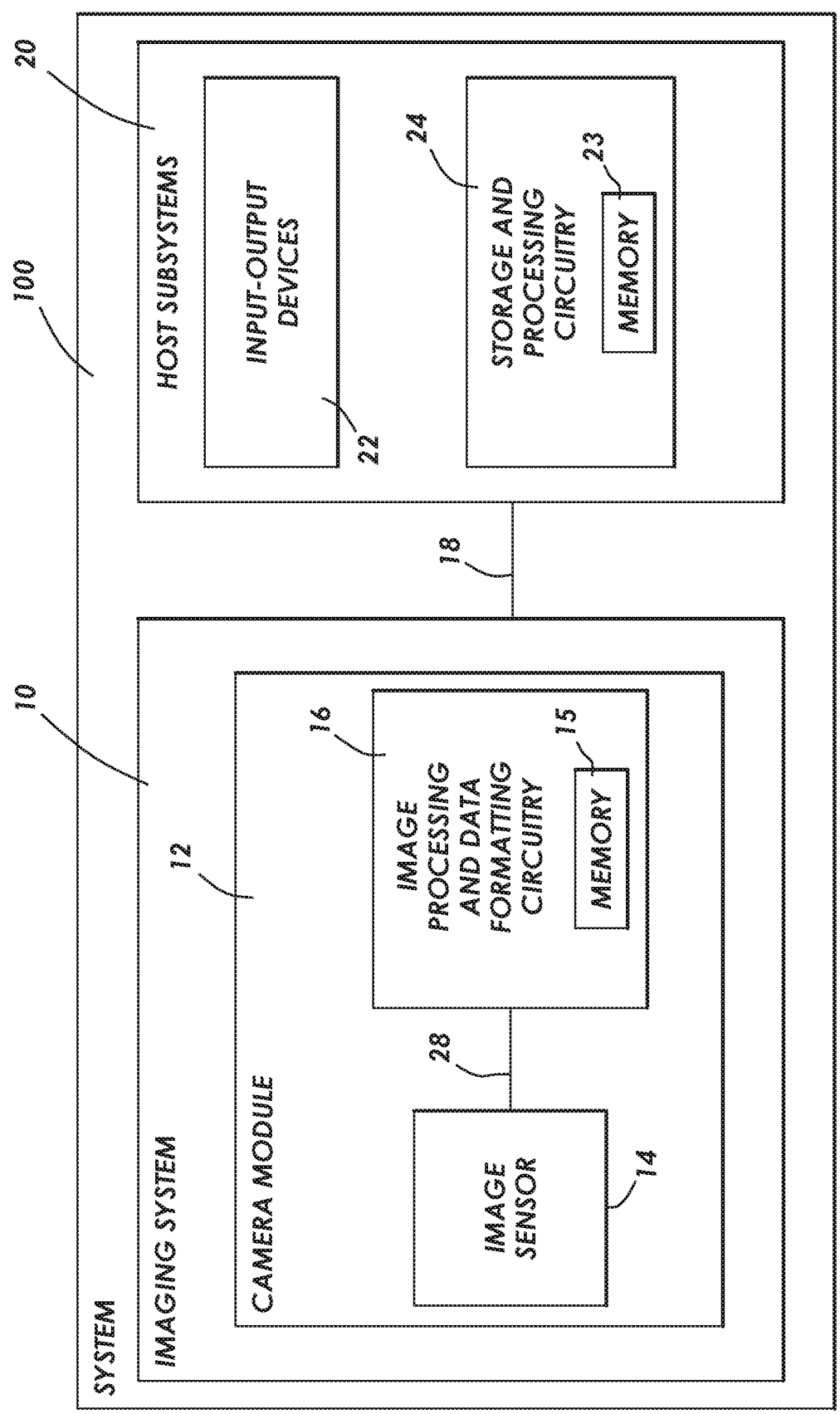
FIG. 1 is a diagram of an illustrative system having memory circuitry in an imaging system and additional memory circuitry in a host subsystem in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system) or other automotive system, may be a surveillance system, or may be any other system having imaging capabilities.

As shown in FIG. 1, system 100 may include an imaging system such as imaging system 10 and host subsystems such as host subsystems 20. Imaging system 10 may include camera module 12. Camera module 12 may include one or more image sensors 14 with one or more corresponding lenses.

Each image sensor in camera module 12 may be identical, or there may be different types of image sensors in a given image sensor array integrated circuit. During image capture operations, each corresponding lens may focus light onto an associated image sensor 14 (such as the image sensor 12 shown in FIG. 2). Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

In an arrangement, which is sometimes referred to as a system on chip (SOC) arrangement, image sensor 14 and image processing and data formatting circuitry 16 may be implemented on a common semiconductor substrate (e.g., a common silicon image sensor integrated circuit die). If desired, image sensor 14 and image processing circuitry 16 may be formed on separate semiconductor substrates. For example, image sensor 14 and image processing circuitry 16 may be formed on separate substrates that have been stacked.

Still and/or video image data from image sensor 14 may be provided to image processing and data formatting circuitry 16 via path 28. Image processing and data formatting circuitry 16 may be used to perform image processing functions (e.g., may process software instructions) such as data formatting, adjusting white balance and exposure, implementing video image stabilization, face detection, object detection, etc. Image processing and data formatting circuitry 16 may also be used to compress raw camera image files if desired (e.g., to Joint Photographic Experts Group or JPEG format). In some configurations, image processing and data formatting circuitry 16 may include memory circuitry 15 used (or accessed) in the processing functions of processing circuitry 16 (e.g., to store the software instructions, processing parameters or variables, image data etc.). Memory circuitry 15 may include volatile and nonvolatile memory (e.g., random-access memory, flash memory, hard drives, solid-state drives, OTP memory, ECC memory, etc.) or any suitable non-transitory computer readable media. Processing circuitry 16 may also include microprocessors, microcontrollers, digital signal processors, application specific integrated circuits, etc. and may include memory controller or memory interface circuitry for controlling and accessing memory 15. Although memory 15 is shown to be within processing circuitry 16, this is merely illustrative. The embodiment herein may refer to memory 15 and processing circuitry 16 as separate circuitries that are functionally different and that are used together.

Imaging system 10 (e.g., image processing and data formatting circuitry 16 in imaging system 10) may convey acquired image data to host subsystem 20 over path 18. Host subsystem 20 may include processing circuitry (e.g., processing circuitry 24) for processing software instructions for detecting objects in images, software instructions for detecting motion of objects between image frames, software instructions for determining distances to objects in images, software instructions for filtering or otherwise processing images provided by imaging system 10, and/or other software instructions.

If desired, system 100 may provide a user with numerous high-level functions. In a computer, cellular telephone, or automotive system, as examples, a user may be provided with the ability to run user applications. To implement these functions, host subsystem 20 of system 100 may have input-output devices 22 such as keypads, input-output ports, joysticks, and displays in addition to storage and processing circuitry 24. Storage and processing circuitry 24 may include memory circuitry 23 used (or accessed) in the processing functions of processing circuitry 24 (e.g., to store the software instructions, processing parameters or variables, image data etc.). Memory circuitry 23 may include volatile and nonvolatile memory (e.g., random-access memory, flash memory, hard drives, solid-state drives, OTP memory, ECC memory, etc.) or any suitable non-transitory computer readable media. Storage and processing circuitry 24 may also include microprocessors, microcontrollers, digital signal processors, application specific integrated circuits, etc. and may include memory controller or memory interface circuitry for controlling and accessing memory 23. Although memory 23 is shown to be within processing circuitry 24, this is merely illustrative. The embodiment herein may refer to memory 23 and processing circuitry 24 as separate circuitries that are functionally different and that are used together.

Figure 2:
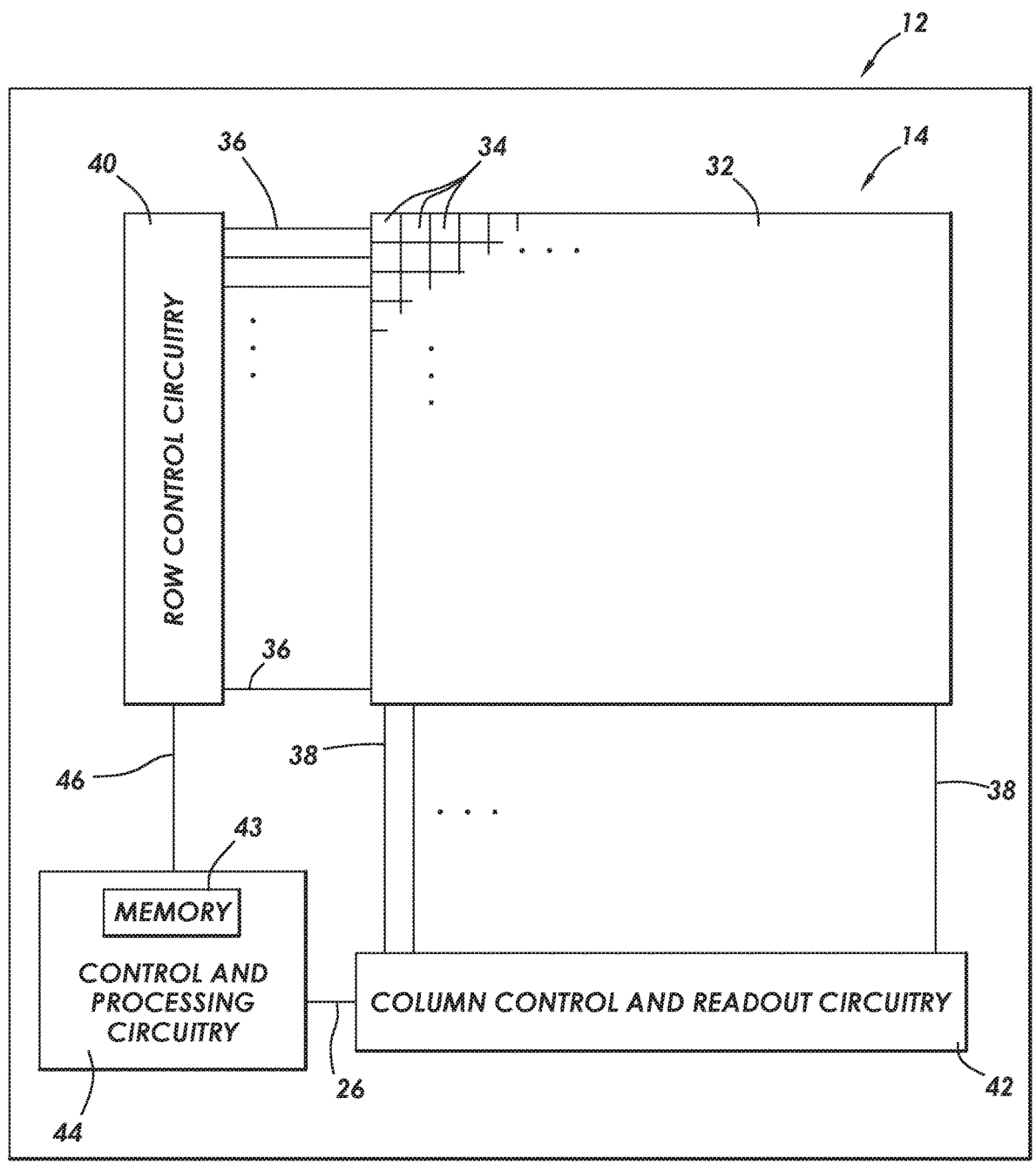
FIG. 2 is a diagram of illustrative imaging circuitry that includes memory circuitry and that is configured to generate image signals in an image sensor in accordance with some embodiments.

An example of an arrangement for camera module 12 of FIG. 1 is shown in FIG. 2. As shown in FIG. 2, camera module 12 includes image sensor 14 and control and processing circuitry 44. Control and processing circuitry 44 may be implemented as part of, may be the same as, or may include image processing and data formatting circuitry 16 in FIG. 1. If desired, processing circuitry 44 may be separate and distinct from image processing and data formatting circuitry 16 in FIG. 1. In particular, control and processing circuitry 44 may include memory 43. Memory 43 may be used (or accessed) in the processing functions of processing circuitry 44 (e.g., to store the software instructions, processing parameters or variables, image data etc.). Memory circuitry 43 may include volatile and nonvolatile memory (e.g., random-access memory, flash memory, hard drives, solid-state drives, OTP memory, ECC memory, etc.) or any suitable non-transitory computer readable media. Although memory 43 is shown to be within processing circuitry 44, this is merely illustrative. The embodiment herein may refer to memory 43 and processing circuitry 44 as separate circuitries that are functionally different and that are used together.

Image sensor 14 may include a pixel array such as array 32 of pixels 34 (sometimes referred to herein as image sensor pixels, imaging pixels, or image pixels 34) and may also include row control circuitry 40 and column control and readout circuitry 42. Control and processing circuitry 44 may be coupled to row control circuitry 40 via path 46 and may be coupled to column control and readout circuitry 42 via path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Control paths 36 may also sometimes be referred to as row lines 36, control lines 36, row control signal lines, etc.

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Pixel array 32 may be provided with a color filter array having multiple color filter elements, which allows a single image sensor to sample light of different colors. As an example, image sensor pixels such as the image pixels in array 32 may be provided with a color filter array that allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 34.

As described in connection with FIGS. 1 and 2, systems such as system 100 in FIG. 1 may include one or more sets of memory circuitry (e.g., memory circuitry 15 and memory circuitry 23 in FIG. 1 and memory circuitry 43 in FIG. 2). One or more of these memory circuitries may include one-time-programmable (OTP) and/or ECC memory circuitry. As an example, one of memory circuitry 15, 23, and 43 may include OTP memory having ECC functionalities (e.g., be ECC-protected). In particular, the ECC-protected OTP memory may include stored data bits and ECC check bits (sometimes referred to herein as parity bits) that are separate and distinct from the data bits. The stored data bits may be one-time programmable (e.g., each data bit may be programmable or flipped from a default bit value once in the lifetime of the memory). The ECC check bits may be used to detect and correct a single-bit error in the stored data bits and may be used to detect, but not correct a two-bit error in the stored data bits (i.e., having single error correction, double error detection or SECDED functionalities). These types of ECC-protected OTP memory are described herein as an example. However, if desired, the embodiments described herein may be implemented with ECC memory, OTP memory, or other types of memory.

In some types of memory (e.g., memory having OTP functionalities and/or ECC functionalities), it may be difficult to update and modify the data (e.g., non-ECC data) stored on the memory. As example, in some applications, it may be desirable to update data bits in the memory after an initial programing of the data bits. However, the one-time-programmable nature of the memory can limit the bits that can be updated, and more importantly, the ECC value generated based on the ECC check bits will likely be altered during such an update. The altered ECC value may lead to the loss of satisfactory ECC functions, which may be critical in some applications.

To maintain the effectiveness of ECC functions, the memory circuitry and the corresponding processing circuitry (e.g., the memory controller circuitry in the processing circuitry) may be implemented according the embodiments described herein. FIG. 3 is a diagram of an illustrative portion of memory 60 (e.g., implemented as a part of memory 15 in FIG. 1, as a part of memory 23 in FIG. 1, implemented as part of memory 43 in FIG. 2, or implemented as a part of any other suitable system).

Memory 60 may include data stored at a first set of bit positions 62 such as bit positions 0 to 15 and may include corresponding ECC check bits (sometimes referred to herein as parity bits) stored at second set of bit positions 64 such as bit positions p0, p1, p2, p3, p4, and p5. In other words, in the illustrative example of FIG. 3, the portion of memory 60 may include 16 bits of data and 6 bits of ECC check bits, each bit storing a binary 1 or 0. Memory 60 may include additional sets of bit portions (e.g., may include additional sets of 16-bit words, each set being associated with additional 6 bits of ECC check bits). As examples, memory 60 may include an OTPM having a size on the order of a few kilobytes (e.g., one or two kilobytes), may have a size less than a kilobyte, may have a size less than one megabyte, may have any other suitable size. As an example described herein, memory 60 may be one-time-programmable memory having ECC functionalities (i.e., memory including ECC check bits). This is merely illustrative. If desired, memory 60 may be or include one or more suitable types of memory.

As shown in FIG. 3, data stored at the first set of bit positions 62 may be associated with different field names (sometimes referred to herein as different fields). As an example, data stored at bit positions 0 to 6 may store data (e.g., one 7 bit word, or one or more binary values) associated with field name VAR. As another example, data stored at bit position 7 may store data (e.g., a binary bit value) associated with field name A. As yet another example, data stored at bit positions 8 to 14 may store data associated with field name Reserved. As a further example, data stored at bit position 15 may store data associated with field name B. If desired, one or more of the bits in the set of bit positions 62 may be spare bits that are not used or are unprogrammed (e.g., at a default bit value).

One or more of these values associated with each of the fields (e.g., of the bits associated with a given field name) may be accessed using processing circuitry (e.g., memory controller (or interface) circuitry) to perform processing functions (e.g., using processing circuitry 16 or processing circuitry 24 in FIG. 1, using processing circuitry 44 in FIG. 2, etc.). As examples, one or more of the stored bits may be used to perform arithmetic calculations, to perform comparison operations, to provide control signals to circuits, to perform cryptographic functions, etc.

Additionally, memory 60 may include ECC check bits corresponding to the data bits in bit positions 62. In particular, changes to one or more of the bits stored at bit positions 0 to 15 may result in changes to one or more of the bits stored at bit positions p0, p1, p2, p3, p4, and p5. The ECC check bits may be used to generate an ECC value (i.e., value X in FIG. 3). The ECC check bits and ECC value may be used to determine whether one or more error has occurred in the data bits stored at the first set of bit positions 62 (e.g., whether one bit in the first set of bit positions 62 has changed, whether two bits in the first set of bit positions 62 have changed, etc.) and in the bits stored at the second set of bit positions 64 (e.g., whether one bit in the second set of bit positions 64 has changed, whether two bits in the second set of bit positions 64 have changed, etc.). As an example, ECC circuitry may receive, as inputs, respective bits at bit positions p0 to p5 (or the ECC value X). Based on the ECC bits or value, the ECC circuitry may determine that a single-bit error has occurred and may correct the single-bit error (e.g., by flipping the error bit, i.e., from a binary value of 0 to 1 or from a binary value of 1 to 0). The respective bits stored at bit positions p0 to p5 are not explicitly shown in FIG. 3 in order to not unnecessary obscure the embodiments described herewith. The collective ECC value X is instead shown.

During the lifetime of memory 60, it may desirable to use a memory controller and/or processing circuitry to alter a stored value at one or more bit positions in the portion of memory 60 shown in FIG. 3. In the illustrative example of FIG. 3, it may be desirable to use the memory controller and/or processing circuitry to update bit 68-1 stored at bit position 15 (i.e., for field B) from the default and unused value of 0 to a new value of 1. However, doing so would undesirably alter the ECC value X even though no error has occurred and the update of bit 68-1 is intentional.

To overcome these issues, the memory controller and/or processing circuitry may update (e.g., may process software instructions to update) bit 68-1 along with additional bits at additional bit positions. By updating the target bit 68-1 along with these specific additional bits, the ECC value may be preserved and the desired updates to memory may be implemented. In the example of FIG. 3, memory 60 includes one or more bits 66 may be previously programmed with a desired set of binary values (each labelled "?"). While each bit is labelled "?", this is to illustrative that these bits are previously programmed to hold useful bits. The value of each of bits 66 may be different from one another (e.g., "?" can represent either a 0 or a 1). Bits 68-1 and 68-2 may be kept as spare or extra (unused) bits available for reprogramming at a different time than bits 66 were initially programmed.

While processing software instructions to update bit 68-1 from a value of 0 to a value of 1, the processing circuitry and/or the memory controller may also process software instructions that also update all of three bits 68-2 from a value of 0 to a value of 1. These updates to memory 60 shown in FIG. 3 may result in the state of memory 60 shown in FIG. 4. While four bits in total may be updated in this process, only the bit value stored at bit position 15 (e.g., the value associated with field name B) may be subsequently accessed and/or used by processing circuitry for subsequent processing functions (e.g., to perform arithmetic calculations, to perform comparison operations, to provide control signals to circuits, to perform cryptographic functions, etc.). The other three bit values stored at bit positions 12 to 14 may be changed only to resolve ECC value consistency issues (e.g., to maintain the same ECC values before and after the bit 68-1 is updated).

As shown in FIG. 4, although the state of the portion of memory 60 has changed, the ECC value associated with the portion of memory 60 has remained the same (e.g., remained at a value of X) relative to the state of the portion of memory 60 shown in FIG. 3. As such, one or more portions of memory 60 (e.g., implemented as OTPM) may be updated without altering the respective ECC values associated with the respective portions of memory 60.

The examples of updating bits at bit positions 12 to 15 and accessing the bit at bit position 15 for subsequent use in FIGS. 3 and 4 are merely illustrative. If desired, any bit of the four updated bits may be accessed for subsequent use. If desired, other (unused and/or spare) bits at other bit positions may be updated to reprogram previously unprogrammed or unused portions of memory. As an example, if bits at bit positions 9, 10, 14, and 15 are unused (e.g., previously unprogrammed, store the default value of 0s or 1s) in a memory of the same type shown in FIG. 3, these bits at bit positions 9, 10, 14, and may be simultaneously flipped to preserve the ECC value, while updating memory 60. At least one bit (e.g., only one bit) of the bits stored at bit positions 9, 10, 14, and 15 is used for subsequent processing, while the other remaining bits may be used only for ECC value consistency reasons. Additional sets of four bits at various corresponding bit positions can similarly be updated (e.g., simultaneously flipped) to preserve ECC value. In particular, in the example of 16-bit words, there may be 64 such 4-bit combinations that preserve the ECC value when simultaneously flipped (e.g., from all 0s to all 1s or from all 1s to all 0s).

Figure 5:
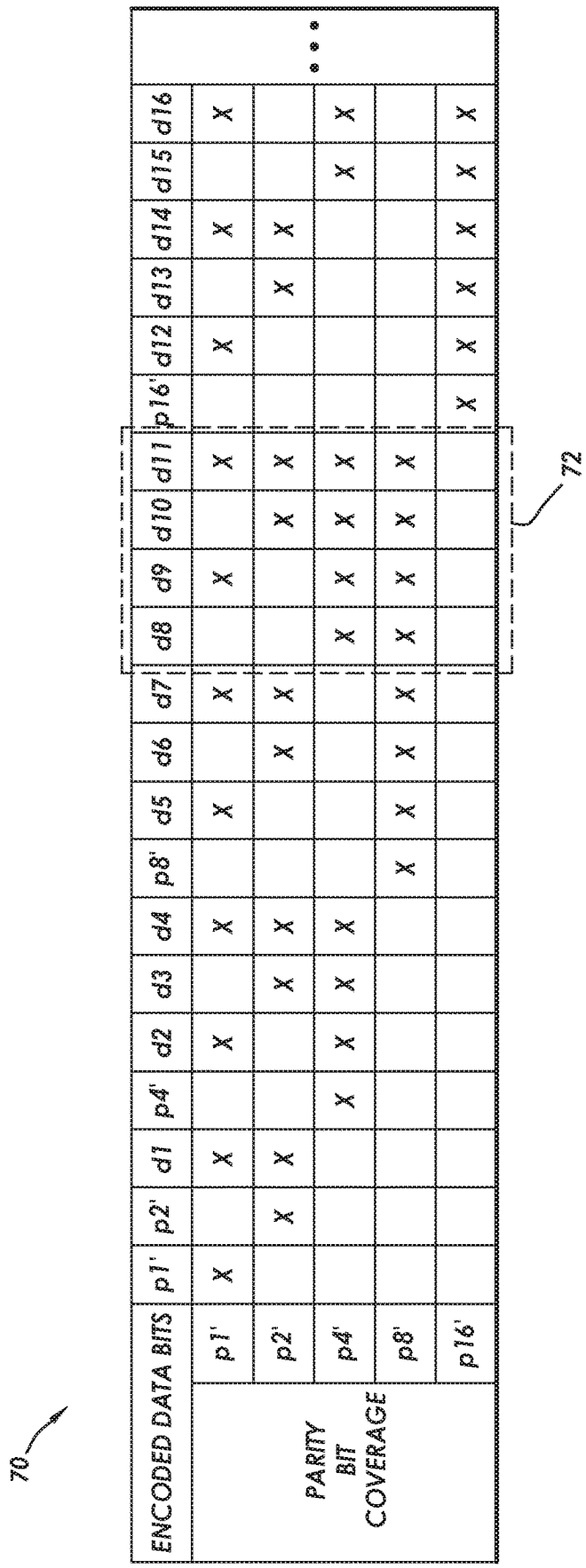
FIG. 5 is an illustrative table that identifies an exemplary set of updateable bit positions to preserve ECC value in memory circuitry of the types shown in FIGS. 1-4 in accordance with some embodiments.

FIG. 5 shows an illustrative table (e.g., table 70) that identifies an exemplary 4-bit combination and the corresponding characteristics associated with the identified 4-bit combinations (and other 4-bit combinations) that, when flipped, preserve the ECC value (e.g., in the manner described in connection with FIGS. 3 and 4). In particular, table 70 shows encoded data bits that includes parity bits p1', p2', p4', p8', and p16' (respectively corresponding to five of the six ECC check bits at positions p0, p1, p2, p3, p4, and p5 as shown in FIGS. 3 and 4, e.g., ECC check bits at positions p1, p2, p3, p4, and p5) interspersed among data bits dl to d16 (corresponding the sixteen data bits at data bit positions 0 to 15 as shown in FIGS. 3 and 4).

The rows of parity bit coverage shows how each parity bit changes based on a change in the encoded data bits. As an example, if dl flips (e.g., by a soft error), both the p1' bit and the p2' bit may be flipped (as shown by "X" in the rows corresponding to parity bit coverage for p1' and p2'). Put another way, when both p1' and p2' bits are flipped, an error in dl may be detected. As another example, if d14 is flipped, the p1' bit, the p2' bit, and the p16' bit may all be flipped. Naturally, when the p1' bit alone flips, this may identity that the p1' bit itself has experienced an error. In a similar manner, a single error in each bit of the entirety of the encoded data bits, including both parity bits as well as data bits, may be identified. Because the specific error bit can be located, the single error may also be corrected (e.g., by flipping the identified error bit).

Based on how parity bits change as identified in table 70, sets of four bits (e.g., four consecutive or non-consecutive bits) that do not change any of the parity bits, when flipped simultaneously, may be identified. Section 72 of table 70 identifies such a set of four bits (e.g., data bits d8, d9, d10, and d11). Since parity bit p1' is flipped twice (because changes to bits d9 and d11 both cause parity bit p1' to be flipped), the value of parity bit p1' remains unchanged when bits d8, d9, d10, and d11 are simultaneously flipped. By similar reasoning, parity bit p2' may similarly be preserved when bits d8, d9, d10, and d11 are simultaneously flipped. Since parity bit p4' is flipped four times (because changes to bits d8, d9, d10, and d11 both all cause parity bit p1' to be flipped), the value of parity bit p4' remains unchanged when bits d8, d9, d10, and d11 are simultaneously flipped. By similar reasoning, parity bit p8' may similarly be preserved when bits d8, d9, d10, and d11 are simultaneously flipped. Since parity bit p16' is never flipped when bits d8, d9, d10, and d11 are simultaneously flipped, parity bit p16' may also be preserved.

In other words, the 4-bit combination may be identified based on the criteria that the p1', p2', p4', p8', and p16' bits are either never flipped or are flipped an even number of times when the 4-bit combination is flipped. These 4-bit combinations need not to be consecutive bits. As an example, an illustrative non-consecutive 4-bit combination may be the dl, d3, d5, and d8 bits.

While table 70 shows 5 parity bits, which corresponds to bits at bit positions p1 to p5 in FIGS. 3 and 4 (as an example), table 70 does not show the final parity bit (e.g., the bit at bit position p0 in FIGS. 3 and 4). The final parity bit may be a parity bit for all of the bits (e.g., for all of the 16 data bits and all of the 5 parity bits). The final parity bit may be used to identify double bit errors.

The illustrative examples in FIGS. 3-5 all show 16-bit memory and 5 or 6-bit ECC value. However, these examples are merely illustrative. If desired, memory 60 may be implemented as 8-bit memory, 32-bit memory, 64-bit memory, etc. having any suitable number of bits for ECC functionalities. Table 70 in FIG. 5, may be expanded to show how parity bit coverage expands when more than 16 bits of data are used.

Figure 6:
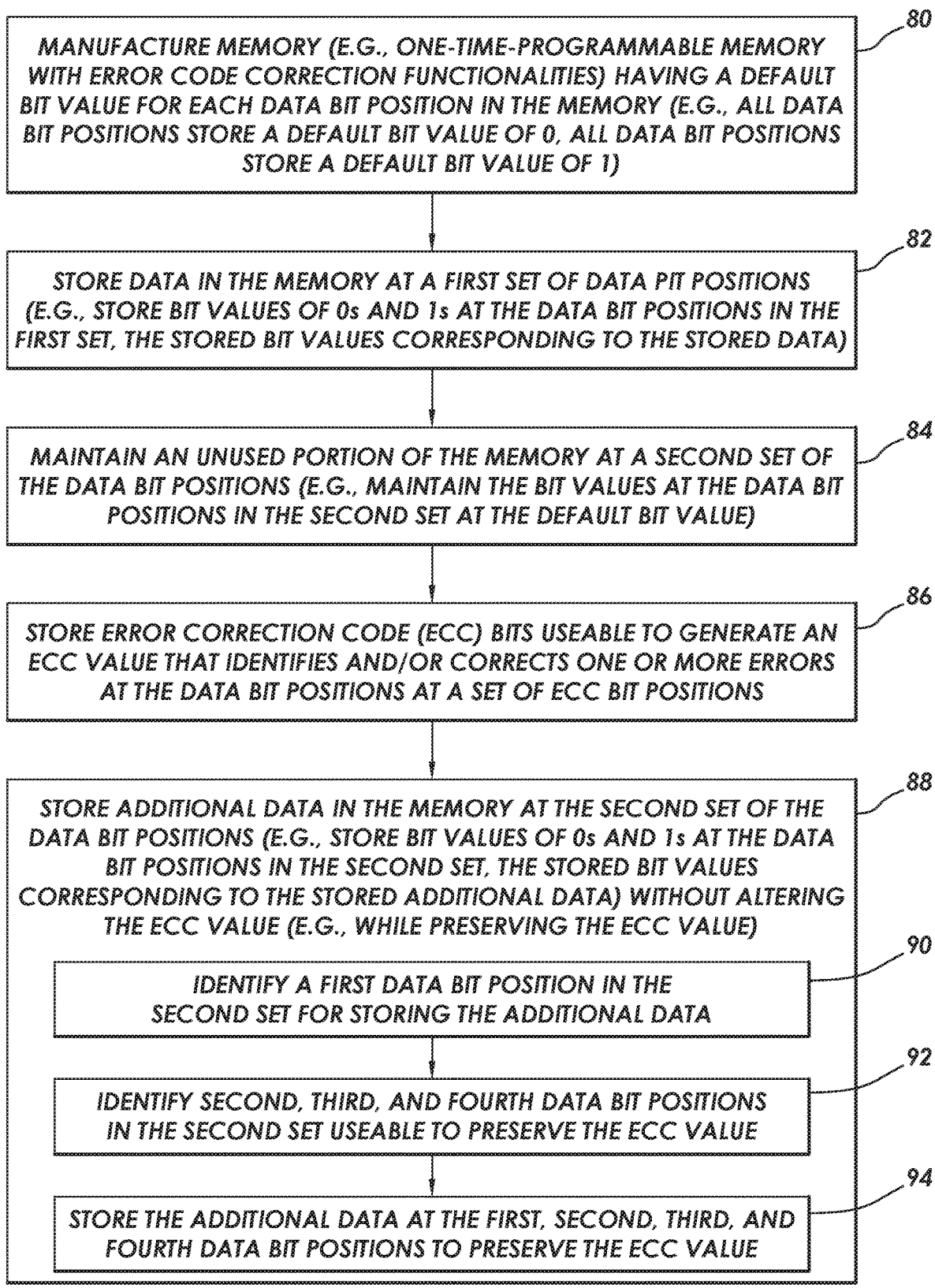
FIG. 6 is an illustrative flowchart for updating memory while preserving an ECC value in accordance with some embodiments.

FIG. 6 is an illustrative flowchart for updating data while preserving the ECC value (e.g., the parity bits at each of the positions). One or more of the portions of the steps in the flowchart of FIG. 6 may be stored as software instructions in memory (e.g., in memory separate from OTPM and/or separate from memory 60 in FIGS. 3 and 4). These software instructions may be processed using processing circuitry (sometimes referred to herein as control circuitry) to perform one or more of the portion of the steps in the flowchart of FIG. 6. The memory and processing circuitry used to store and/or process these instructions may be implemented in the system of FIG. 1 (e.g., using a portion of memory 15 and processing circuitry 16, or using a portion of memory 23 and processing circuitry 24), or the circuitry of FIG. 2 (e.g., using a portion of memory 43 and processing circuitry 44), as examples.

At step 80, a manufacturer may physically fabricate memory circuitry (e.g., memory circuitry 60, an OTPM with ECC functionalities, etc.). The memory may have a default bit value for each data bit position in the memory (e.g., all data bit positions may store a default bit value of 0, all data bit positions may store a default bit value of 1, etc.). If desired, during step 80, processing circuitry may process software instructions (stored in a non-transitory computer readable medium) that virtually assign the memory (e.g., by implementing the memory in software using programmable circuitry) instead of physically manufacturing the memory.

At step 82, processing circuitry may process software instructions (stored in a non-transitory computer readable medium) to store data in the memory at a first set of data bit positions (e.g., may store bit values of 0s and is at the data bit positions in the first set of data bit positions, the stored bit values corresponding to the stored data). As an example, the processing circuitry may process software instructions to store data at bits 66 in memory 60 of FIG. 3.

At step 84, processing circuitry may process software instructions (stored in a non-transitory computer readable medium) to maintain an unused portion of the memory at a second set of the data bit positions (e.g., maintain the bit values at the data bit positions in the second set of data bit position at the default bit value). As an example, the processing circuitry may process software instructions to maintain bits 68-1 and 68-2 in memory 60 of FIG. 3 at a default value of 0.

At step 86, processing circuitry may process software instructions (stored in a non-transitory computer readable medium) to store ECC bits useable to generate an ECC value that identifies and/or corrects one or more errors at the data bit positions at a set of ECC bit positions (e.g., that imparts SECDED functionalities). As an example, the processing circuitry may process software instructions to store ECC check bits at bit positions p0, p1, p2, p3, p4, and p5 of memory 60 of FIG. 3.

At step 88, processing circuitry may process software instructions (stored in a non-transitory computer readable medium) to store additional data in the memory at the second set of the data bit positions (e.g., store bit values of 0s and is at the data bit positions in the second set of data bit positions, the stored bit values corresponding to the stored additional data). This storage of the additional data may be done without altering the ECC value (e.g., while preserving the ECC value).

To perform step 88, processing circuitry may process software instructions (stored in a non-transitory computer readable medium) associated with steps 90, 92, and 94. In particular, at step 90, processing circuitry may process software instructions (stored in a non-transitory computer readable medium) to identify a first data bit position in the second set of data bit positions for storing the additional data. As an example, the processing circuitry may process software instructions to identify bit 68-1 of memory 60 of FIG. 3 to store the additional data (e.g., to flip bit 68-1 from a default value of 0 to a value of 1).

At step 92, processing circuitry may process software instructions (stored in a non-transitory computer readable medium) to identify second, third, and fourth data bit positions in the second set of data bit positions useable to preserve the ECC value. As an example, the processing circuitry may process software instructions to identify bits 68-2 in memory 60 of FIG. 3 to preserve the ECC value (e.g., at least in part by referencing parity bit data such as parity bit coverage table 70 in FIG. 5).

At step 94, processing circuitry may process software instructions (stored in a non-transient computer readable medium) to store the additional data at the first, second, third, and fourth data bit positions to preserve the ECC value. As an example, the processing circuitry may process software instructions to flip all of bits 68-1 and 68-2 in memory 60 of FIG. 3 to store the additional data while preserving the ECC value.

FIG. 7 shows an illustrative table (e.g., table 110) that identifies data bits, parity bits, and exemplary meanings of the data bits in memory (e.g., OTPM). In particular, column 112 shows data bits (e.g., 16-bit words) in memory that can be used to provide version data (e.g., in column 116). Column 112 shows parity bits associated with the data bits for checking errors in the parity bits.

In particular, row 118 may identify the data words and parity bits associated with version data indicative of an initial version. In order to use a limited number of data bits to express different version data while maintaining parity bit value at least between some version numbers, the method and systems described in connection with FIGS. 1-6 may be employed. As an example, row 120 shows data indicative of Version 1. By updating the data bits through flipping four different bits, memory may store data indicative of Version 2. Similarly, version data such as Version 4 (in row 126) and Version 5 (in row 128) may be expressed from data bits indicative of Version 3 (in row 124) by updating four bits while preserving the parity bits value.

The foregoing is merely illustrative of the principles of this invention and various modifications can be made by those skilled in the art. The foregoing embodiments may be implemented individually or in any combination.

What is claimed is:

1. A system comprising:
   memory circuitry that stores a first set of data bits and a second set of parity bits for the first set of data bits; and
   control circuitry coupled to the memory circuitry and configured to update a first bit in the first set of data bits by updating the first bit, a second bit in the first set of data bits, a third bit in the first set of data bits, and a fourth bit in the first set of data bits, wherein the first, second, third, and fourth bits, when updated, are configured to preserve the second set of parity bits in the memory circuitry.

2. The system defined in claim 1, wherein the memory circuitry comprises one-time-programmable memory that stores the first set of data bits and the second set of parity bits.

3. The system defined in claim 2, wherein the second set of parity bits are configured to provide single error correction functionalities for the first set of data bits.

4. The system defined in claim 3, wherein the second set of parity bits are configured to provide double error detection functionalities for the first set of data bits.

5. The system defined in claim 2, wherein each bit of the one-time-programmable memory is one-time-programmable.

6. The system defined in claim 5, wherein the first set of data bits includes a first plurality of programmed bits and a second plurality of programmable bits.

7. The system defined in claim 6, wherein each bit in the second plurality of programmable bits has a same default bit value.

8. The system defined in claim 6, wherein the second plurality of programmable bits include the first, second, third, and fourth data bits.

9. The system defined in claim 1, wherein the control circuitry is configured to update the first bit by simultaneously updating the first, second, third, and fourth bits.

10. The system defined in claim 9, wherein the control circuitry is configured to identify respective bit locations of the second, third, and fourth bits based on a bit location of the first bit.

11. A method of updating one-time-programmable memory having error correction code functionalities, the method comprising:
    storing data at a first set of data bit positions in the one-time-programmable memory;
    maintaining an unused portion of the one-time-programmable memory at a second set of data bit positions in the one-time-programmable memory;
    storing error correction code bits for the first and second sets of data bit positions; and
    storing additional data at the second set of the data bit positions while preserving the error correction code bits.

12. The method defined in claim 11, wherein storing the additional data comprises:
    storing the additional data at a first data bit position in the second set of data bit positions; and
    identifying additional data bit positions in the second set of data bit positions for preserving the error correction code bits.

13. The method defined in claim 12, wherein storing the additional data comprises:
    storing the additional data at the additional data bit positions in the second set of data bit positions.

14. The method defined in claim 13, wherein storing the additional data comprises:
    simultaneously storing the additional data at the first data bit position and at the additional data bit positions.

15. The method defined in claim 14, wherein simultaneously storing the additional data at the first data bit position and at the additional data bit positions comprises:
    flipping a default bit value at each bit position in the first data bit position and in the additional data bit positions.

16. The method defined in claim 11, wherein each bit in the unused portion of the one-time-programmable memory stores a same default bit value.

17. The method defined in claim 11, wherein each bit of the one-time-programmable memory is one-time-programmable.

18. An imaging system comprising:
    an image sensor;
    one-time-programmable memory having error correction code functionalities, the one-time-programmable memory storing data at a first set of data bit positions, maintaining a same default bit value at each bit position in a second set of data bit positions in the one-time-programmable memory, and storing parity bits corresponding to an error correction code value for the first and second sets of data bit positions; and
    processing circuitry coupled to the image sensor and to the one-time-programmable memory, wherein the processing circuitry is configured to store additional data at the second set of the data bit positions while preserving the error correction code value.

19. The imaging system defined in claim 18, wherein the processing circuitry is configured to store the additional data by updating exactly four bit values at corresponding bit positions in the second set of data bit positions.

20. The imaging system defined in claim 18, wherein the processing circuitry is configured to store the additional data at a target bit position in the second set of data bit positions and is configured to identify additional spare bit positions configured to preserve the error correction code value.

* * * * *